United States Patent [19]

Yoshida et al.

[11] 4,378,390

[45] Mar. 29, 1983

[54] PROCESS OF COATING A METAL STRIP WITH HIGH-VISCOSITY COATING MATERIAL

[75] Inventors: Makoto Yoshida; Fumio Yamamoto, both of Kitakyushu, Japan

[73] Assignee: Nippon Steel Corporation, Tokyo, Japan

[21] Appl. No.: 308,851

[22] Filed: Oct. 5, 1981

Related U.S. Application Data

[60] Division of Ser. No. 133,286, Mar. 24, 1980, abandoned, which is a continuation of Ser. No. 927,908, Jul. 25, 1978, abandoned.

[51] Int. Cl.³ .............................................. B05C 1/08
[52] U.S. Cl. .................................... 427/428; 118/262
[58] Field of Search ............... 118/262, 249, 224, 227, 118/212; 101/197, 366; 427/428

[56] References Cited

U.S. PATENT DOCUMENTS

| | | | |
|---|---|---|---|
| 2,177,656 | 10/1939 | Kaddeland | 101/366 X |
| 2,293,691 | 8/1942 | Harrigan | 118/262 X |
| 2,681,636 | 6/1954 | Fridolph | 118/262 X |
| 2,911,942 | 11/1959 | Gross | 118/212 X |
| 3,641,932 | 2/1972 | Behringer | 101/157 |
| 3,789,795 | 2/1974 | Brandenburg | 118/262 |
| 3,951,102 | 4/1976 | Allen | 118/262 X |

FOREIGN PATENT DOCUMENTS 857110  12/1960  United Kingdom ................ 118/212

*Primary Examiner*—John P. McIntosh
*Attorney, Agent, or Firm*—Wenderoth, Lind & Ponack

[57] ABSTRACT

An apparatus for applying a coating of high-viscosity coating material onto a metal strip at high speed, wherein the apparatus has
a roll having recesses or grooves thereon;
a supplying source for forcedly filling the coating material in the recesses or grooves provided on the roll;
a doctor for removing excessive coating material remaining on the roll having recesses or grooves other than the coating material filled in the recesses or grooves;
a coating roll which rotates in contact with the roll having recesses or grooves;
at least one smoothing roll of smaller diameter which rotates in contact with the coating roll; and
a back-up roll which holds the metal strip against the coating roll.

5 Claims, 7 Drawing Figures

PROCESS OF COATING A METAL STRIP WITH HIGH-VISCOSITY COATING MATERIAL

This application is a division of Ser. No. 133,286, filed Mar. 24, 1980, now abandoned, which is a continuation of Ser. No. 927,908, filed July 25, 1978, now abandoned.

BACKGROUND OF THE INVENTION

1. Field of the Invention

The present invention relates to an apparatus for coating a metal strip with a coating material comprising a high-viscosity liquid, such as non-solvent paints, inks and emulsions, thinnly and smoothly at a relatively high speed.

2. Description of the Prior Art

Prior to now, pick-up roll, multiple-step kneading roll, and photogravure roll methods have been used for applying a thin coating on a metal strip. These methods are selectively used depending on the type and nature of the coating materials, the coating speed and other factors.

The pick-up roll method, as shown in FIG. 1, picks up the coating material 1' by means of the pick-up roll 9 immersed in the paint pan 1, controlling the amount of the picked up coating material with the contact pressure between the coating roll 5 (or a bracket roll) and the pick-up roll, and applying the controlled amount of coating material onto the metal strip 7. A modified pick-up roll method may include controlling the amount of the picked up coating material by the distance between the pick-up roll 9 and the metering roll 10 provided in contact with the pick-up roll 9, transferring the controlled amount of the coating material onto the coating roll, and applying the coating material onto the metal strip 7.

This pick-up roll method has the advantage that the coating material can be easily applied onto the metal strip with relatively simple equipment, but has the following technical disadvantages and has very limited use in high-speed applications of a coating material composed of a high-viscosity liquid onto a metal strip.

In general, the high-viscosity liquid can not be picked-up by the roll when the roll rotates at a high speed. The experiments conducted by the present inventors have revealed that there exists a correlation as illustrated in FIG. 5 between the viscosity of coating materials and the speed of the pick-up roll. Thus, the pick-up of the coating material is impossible within the oblique-lined zone in FIG. 5.

Therefore, in cases of high-speed coating with a coating material having a viscosity not lower than 500 cp with a coating speed not lower than 50 m/min., to which the present invention is particularly directed, the coating material can not be picked-up by the pick-up roll and thus it is impossible by the pick-up roll method to apply a coating material composed of a high-viscosity liquid onto a metal strip.

The pick-up roll method has a further disadvantage in that the thickness of the resultant coatings vary depending on changes in the coating speed. For example, as clearly understood from the results shown in FIG. 6 obtained by measuring the correlation between the coating speed and the thickness of the coatings, the thickness increases in proportion to the increase of the coating speed. Therefore, in a continuous coating operation of a steel strip, where the running speed of the strip changes every time the strip is jointed to a subsequent steel strip, it becomes very difficult to obtain a uniform coating thickness on the final product.

Further, the coating material composed of a high-viscosity liquid results in further problems in that when it is used for a long-time in a high-speed coating operation, it mixes with the air and generates fine air bubbles therein as a result of being stirred by the rotation of the pick-up roll immersed therein. The bubbles generated in the coating material are transferred together with the coating material to the pick-up roll, then to the bracket roll, further to the coating roll and lastly to the metal strip where they result in coating defects, such as pin holes, and damages the coating finish. It should be noted that the bubbles entangled in the coating material are harder to remove as the viscosity of the coating material increases in addition to there being an increased likelihood of coating defects.

The second conventional method, the multiple-step kneading roll method has been used for coating of printing inks in general. As shown in FIG. 2, this method comprises leading out the ink contained in the ink pan 101 by means of the leading out roll 109, controlling the amount of the ink to be applied through the number of contacts of the transfer roll 111 with the leading out roll 109 and one of the kneading roll group 112, which is made up of a plurality of metal rolls and rubber rolls transferring the ink to others of the kneading roll group whereby the ink is spread thinnly and uniformly on the rolls and transferred to the printing roll 113. The plate cylinder has a relief or flat plate for printing.

The ink transferred onto the printing roll 113 is further transferred onto the coating roll 105 and then onto the metal strip 107. The multiple-step kneading roll method has the advantages that a high-viscosity coating material can be applied thinnly and uniformly on a metal strip running at a high speed, but has the following disadvantages.

In the multiple-step kneading roll method, the transfer of the coating materials to and among a number of rolls is largely limited by the physical properties, particularly rheological properties of the coating material itself, such as viscosity and thixotropy, and when these properties are not appropriate, it becomes impossible to spread the coating material thinnly and uniformly by means of the kneading rolls or to transfer it from roll to roll.

Therefore, in order to obtain rheological properties of the coating material suitable for coating through the multiple-step kneading roll method, it becomes necessary to adjust the coating material by mixing additional chemicals therein in a complicated manner. Also the coating material in this method is limited with respect to flowage, for example, a slurry of coating material composed of inorganic substances and water soluble resins which are used for forming a heat-resistant and insulating coating on metal articles can not be used in this method.

Further, the multiple-step kneading method requires large scale precision machines which require not only a great amount of capital and maintenance expenses, but also technical skill in controlling the thickness of the coatings.

The third conventional method, the photogravure roll method, as shown in FIG. 3, comprises picking up the paint contained in the pan 201 by means of the photogravure roll 203 immersed in the paint, removing the excess of the paint picked up by means of the doctor knife 202, transferring the paint onto the coating roll 205 and then onto the metal strip. This method has the advantages that it is easy to control the thickness of coatings because the amount of coating material is controlled by the photogravure roll and the doctor knife, but this method has the following disadvantages.

For the same reason as in the pick-up roll method, it is impossible to apply a coating material composed of high-viscosity liquids because fine bubbles are generated and entangled in the coating material and tend to cover recesses or grooves of the photogravure roll, thus hindering filling up of the recesses or grooves with the coating material. This incomplete filling of the recesses or grooves with the coating material causes serious coating defects, such as pin holes and a deteriorated flatness and smoothness of the coated surface of the metal strip.

SUMMARY OF THE INVENTION

Therefore, one of the objects of the present invention is to overcome the various disadvantages of the conventional methods, and to provide an apparatus which can apply high viscosity liquids, such as non-solvent paints, printing inks, liquids composed of water soluble resin, inorganic substance (slurry) and lubricant in a form of a thin and smooth coating uniformly on a metal strip at a relatively high speed.

The apparatus according to the present invention for achieving the above object comprises a supply means for supplying a coating material composed of a high viscosity liquid on a roll having recesses or grooves to fill at least the recesses or grooves with the coating material, a doctor knife for removing excessive coating material other than the coating material filling the recesses or grooves on the roll, a transfer roll which contacts the roll having the recesses or grooves and transfers the coating material filling the recesses or grooves, at least one smoothing roll having a small diameter which contacts the transfer roll or directly with the roll having the recesses or grooves and a back-up roll which holds the metal strip against the coating roll.

The high-viscosity liquid used in the present invention is a liquid having a viscosity which has been conventionally considered impossible to use for coating in high-speed coating, particularly a viscosity of 500 cp or higher, and more specifically from 1000 cp to 80,000 cp. Thus, the high-viscosity liquid includes, for example, non-solvent paint, printing inks, a mixture of water soluble resin, inorganic substance and lubricant, and the paint may include ultraviolet ray hardening and electron beam hardening paints, such as acrylic paints and epoxy paints.

The metal strip, on which the coating material composed of the high-viscosity liquid is coated, includes a steel strip coil, or a steel sheet or a strip coated with a metal such as zinc, tin, nickel or chromium, and the coating material is applied to the metal strip uniformly and smoothly in a thickness having a range from $1\mu$ to $30\mu$, preferably from 1 to $10\mu$ at a coating speed in the range of 50 to 300 m/min.

In the present invention, it is not always necessary to maintain the ratio of the rotation speed of the roll having recesses or grooves to the running speed of the metal strip to be applied with the coating material at 1 to 1, but the ratio may be changed up to 1 to 1.3

The present invention will be described in detail by referring to the attached drawings.

DETAILED DESCRIPTION OF THE INVENTION

Figure 4A:
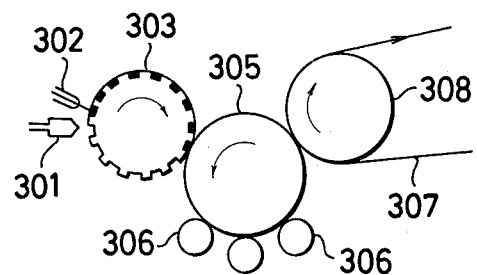
FIG. 4 (a) and (b) show respectively different embodiments of the apparatus according to the present invention.

In the embodiment of the apparatus according to the present invention shown in FIGS. 4(a) (b), the coating material is supplied to the roll 303 having recesses or grooves by means of the supplying device 301, and the excessive coating material on the roll surface other than the coating material filling the recesses or grooves is removed by the doctor knife 302 which is designed to contact or depart from the roll surface.

The means for supplying the coating material to the roll having recesses or grooves in the present invention is very important because it enables high-speed coating with a high-viscosity coating material which has previously been impossible to accomplish with conventional methods.

Figure 1:
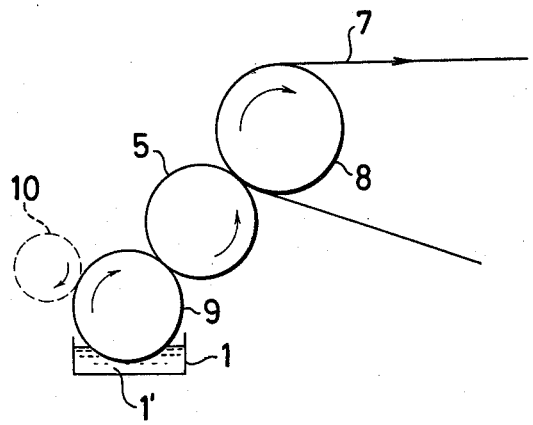
FIGS. 1 to 3 show respectively schematic views of conventional coating apparatus.
Figure 2:
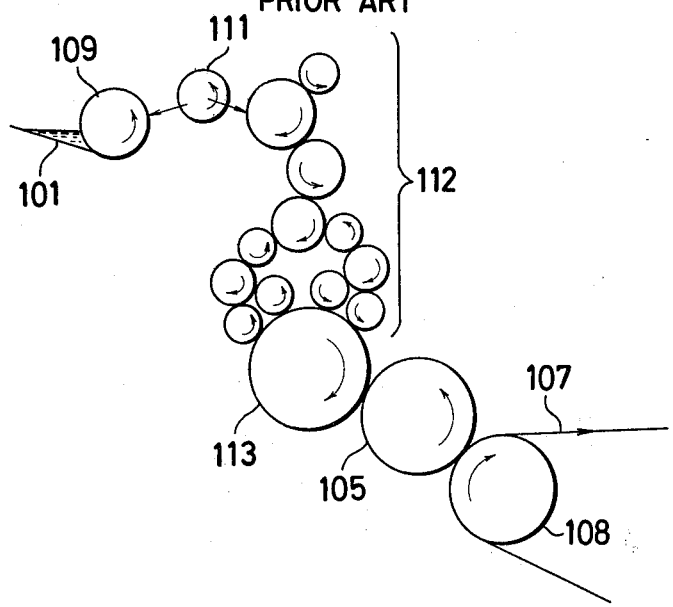
Figure 3:
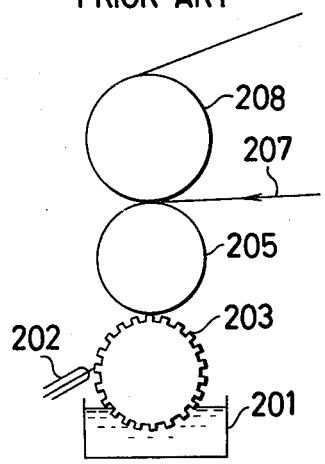
Figure 5:
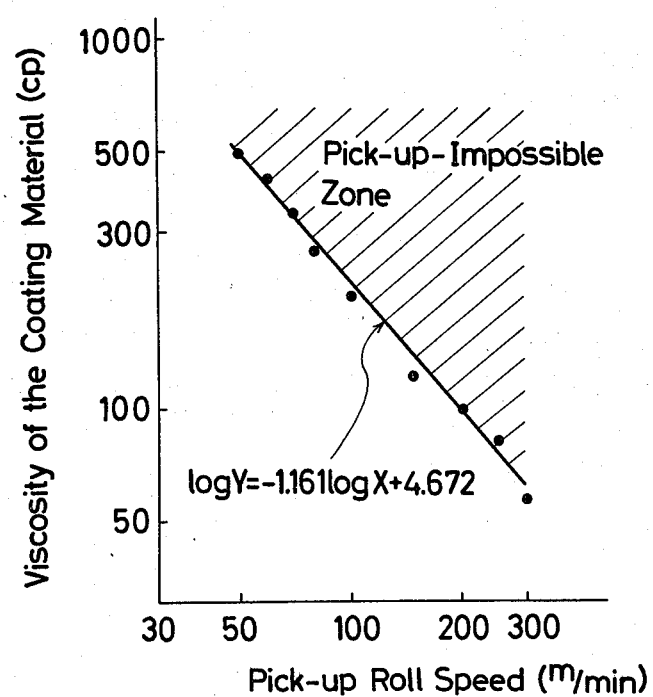
FIG. 5 is a graph showing the pick-up zone of the coating material in relation to the viscosity of the coating material and the coating speed.
Figure 6:
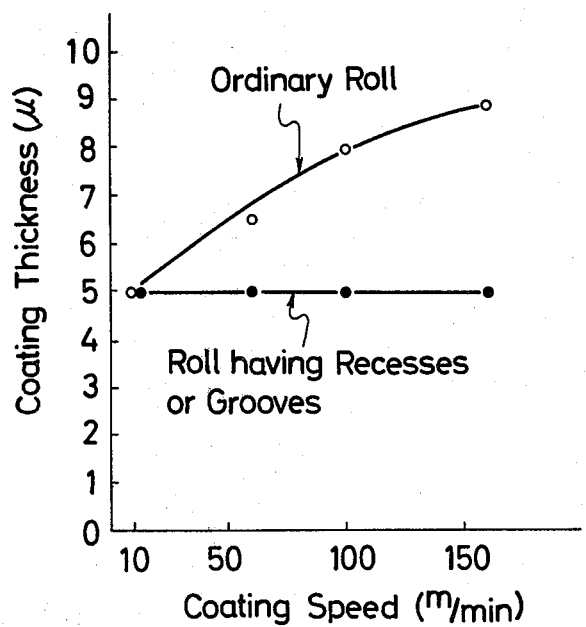
FIG. 6 is a graph showing the relation between the coating speed and the coating thickness.

The present inventors have conducted experiments to determine the limitations within which the coating material can be picked up by the photogravure roll from the paint pan shown in FIG. 3. The coating material used in these experiments was prepared by adding neo pentyl glychol diacrylate as a solvent to UV curing epoxy resin (produced and sold by Kansai Paints Co. Ltd., Japan, under the trade name SK-1000), so as to adjust the viscosity to various different values. The rotational between the rotation speed (m/min.) of the photogravure roll for picking up the coating material, and the viscosity (cp) of the coating material is shown in FIG. 5 (the pick-up is impossible in the oblique-lined zone), from which it becomes clear that as the rotational speed of the roll is increased, it becomes necessary to lower the viscosity of the coating material in order to satisfactorily pick up the coating material with the roll, and that the line of criticality as determined by the viscosity (Y) of the coating material and the roll rotation speed (X) which permits the pick-up can be formulated from this graph as:

$$\log Y = -1.161 \log X + 4.672$$

Thus so far as $\log Y \geq -1.161 \log X + 4.672$ (the oblique-lined zone), it is impossible to pick up and apply the coating material on the metal strip.

In the present invention, a specific supplying means for applying a coating material having a viscosity not lower than 500 cp at a high speed is provided in order to make possible the coating operation in the above pick-up-impossible zone.

The supplying device 301 comprises a nozzle having a slit opening and a pump for pumping the coating material. The coating material is supplied in the following way.

The coating material is forced out in the form of a film which is free from air bubbles from the slit opening under a pressure not lower than 0.2 kg/cm², preferably ranging from 1 to 2 kg/cm which is supplied by the pump for forcedly supplying the coating material into the recesses or grooves of the roll and for expelling the air occupying the recesses or grooves. Therefore, the recesses or grooves of the roll are filled with the coating material which is forcedly supplied thereto without any air remaining in the recesses or grooves.

Instead of forcedly supplying the coating material to the recesses or grooves, the coating material may be supplied from the nozzle on the non-recessed or non-grooved portion of the roll surface and then forcedly filled into the recesses or grooves by the wedge effect of the doctor knife. In any case, it is necessary to forcedly fill and retain the coating material in the recesses or grooves on the roll surface.

In the above embodiment, the arrangement of the nozzle and the doctor knife may be made at any desirable position around the circumference of the roll having recesses or grooves, but should be at a position at which they do not hinder the rotation of the transfer roll 304, the smoothing rolls 306 and the coating roll 305, and it is desirable that the nozzle and the doctor knife be arranged as close as possible to each other, preferably at a distance not greater than 30 mm. Regarding the angle of the doctor knife, it is desirable to arrange the nozzle at an angle in a range from 0 to 90° with respect to the normal axis of the roll in order to efficiently remove the excessive coating material remaining on the roll surface other than in the recesses or grooves.

The roll 303, having recesses or grooves, is prepared by applying a nickel or copper coating on a steel roll, subjecting the coated roll to etching or sculpturing, hard chrome plating and then grinding. The patterns of the recesses or grooves are selected in view of the type and the nature of the coating material as well as the thickness of coating desired with usually square, triangle, trapezoid and linear patterns being used.

Regarding the size of the recesses or grooves, a square of 50 to 200μ, for example, may be used, and 50 to 200μ of these squares may be arranged for a unit length of 1 inch on the roll surface and the depth of the recesses and grooves may be selected as desired with usually 5 to 100μ depth being used.

The amount of high-viscosity coating material applied on the metal strip is restricted by the capacity of the recesses or grooves, but is not influenced by the rotational speed of the roll (the coating speed or the running speed of the metal strip).

The high-viscosity coating material filling the recesses or grooves is then transferred to the transfer roll 304 which is made of an elastic material, such as rubber, or which is coated with such a material (FIG. 4 (b). The surface hardness, namely the hardness of the rubber of the transfer roll and the contact pressure between the roll having recesses or grooves and the transfer roll will have substantial influence on the transfer of the high-viscosity coating material, and therefore they must be appropriately selected in view of the type and nature of the coating material and the thickness of coating to be applied. The transfer roll 304 may be selected in accordance to the viscosity of the coating material, and may be omitted when a coating material having a viscosity of 2000 cp or less is used (FIG. 4(a).

The coating material transferred onto the transfer roll 304 and distributed in patterns corresponding to the patterns of the recesses or grooves on the roll 303, and the coating material distributed in such patterns on the transfer roll, when directly applied to the metal strip 307 will not give a flat and smooth coating appearance. Therefore, the coating material on the transfer roll 304 is transferred to the coating roll 305. The coating material can then be spread smoothly to a great degree by the contact pressure between the transfer roll 304 and the coating roll 305, and being further spread by means of the small diameter smoothing rolls 306 for obtaining complete smoothness of the coating material, so that it is then applied onto the metal strip.

The smoothing rolls 306 which are supported in contact with the coating roll 305 may be made of rubber, but it is particularly advantageous to use a metal roll coated with a bright chrome plating. The number, diameter and rotational speed of the smoothing roll may be selected depending on the type and nature of the coating material and the thickness of coating to be applied. It is also possible to obtain a more uniform thickness of coating across the width of the metal strip by reciprocatingly moving the smoothing roll or the coating roll in the axial direction of the roll.

As described previously, the transfer roll 304 may be omitted when the coating material has a relatively low viscosity. In such a case, as shown in FIG. 4(a), the coating material is transferred from the roll 303 having the recesses or grooves directly onto the coating roll 305. In this case, however, it is preferable that the number of the small diameter smoothing rolls 306 which contact the surface of the coating roll 305 be one or more greater than in the case where the transfer roll is used, but the number of the smoothing rolls should be adjusted in view of the viscosity of the coating material and the coating speed etc., as described above and thus it is not always necessary to increase the number of the rolls when a relatively low viscosity of coating material is used.

The coating material uniformly spread on the surface of the coating roll 305 by the smoothing roll 306 is transferred and applied onto the metal strip 307 running around the back-up roll 308 in contact with the coating roll 305.

Regarding the diameter of the smoothing rolls 306, a smaller diameter is more effective for obtaining a smooth coating, but the diameter is usually determined with respect to the roll axial length from the point of view of the rigidity which is required. Thus a diameter from 70 to 100 mm to a roll axial length of 1 m is preferable.

Regarding the drive system of the various rolls, they may be independently drive by their own driving source, or one drive source may be used for a pair of upper and lower rolls by means of a belt etc. In any case, it is necessary to minimize the vibration of the rolls.

Regarding the circumferential speed of the smoothing roll 306, it is preferable to maintain the speed at no more or less than 50% respectively than the circumferential speed of the coating roll 305. Further, regarding the axial movement of the smoothing roll, it is advantageous that the movement be done at a speed of 1/10 to 1/50 of the circumferential speed of the coating roll.

The advantages of the present invention may be summarized below:

1. It is possible to apply a uniform and smooth thin coating of coating material composed of high-viscosity liquid at high coating speeds.

2. It is easy to control the thickness of the coating to be applied (the thickness of coating does not change depending on the running speed of the metal strip).

3. It is possible to apply a uniform and smooth thin coating even in the case of a coating material having no property.

4. The apparatus is simple and is easy to operate and maintain.

EXAMPLES OF THE PREFERRED EMBODIMENTS

The present invention will be more clearly understood from the following examples.

EXAMPLE 1

Figure 4B:
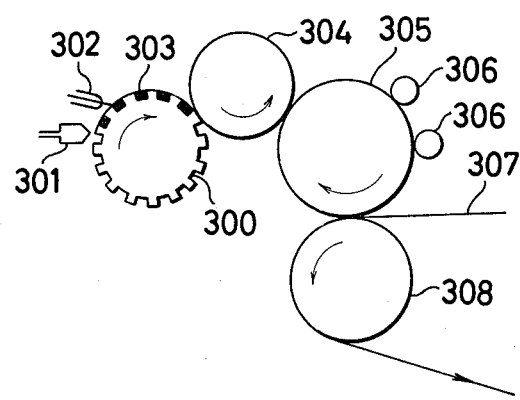

A steel strip coil having a thickness of 0.5 mm and a width of 914 mm is continuously passed through a molten bath of zinc for zinc coating and then coated with a ultraviolet ray hardening primer paint (acryl epoxy resin paint; viscosity; 2300 cp at 25° C.) by using the apparatus of the present invention as shown in FIG. 4(b).

The paint is supplied under a pressure of 0.2 kg/cm$^2$ with the pressure supplied by a non-pulsive pump to the roll 303 having a 400 mm diameter, and having recesses or grooves 300 into which paint is supplied by the supplying device 301. The recesses or grooves 300 on the roll 303 are square recesses or grooves of $140\mu \times 140\mu$ and $40\mu$ in depth and 128 of such square recesses or grooves are provided per 1 inch of the circumferential length of the roll, and the transfer roll 304 having a 400 mm diameter and the coating roll having a 400 mm diameter have a surface (rubber) hardness equal to 70. The smoothing roll 306 is a chrome plated metal roll having a 50 mm diameter, and in this example, two smoothing rolls are used and rotated at a circumferential speed of 1/50 of the circumferential speed of the coating roll 305. The resultant coating on the steel strip is smooth and maintains a uniform thickness ranging from 6 to $8\mu$ even when the running speed of the steel strip varies in a range from 50 to 150 m/min.

Regarding the method of supplying the coating material, instead of the pumping system, the coating material may be dropped onto the roll surface from an upper hopper and shaved off by the doctor knife. In this case, satisfactory coatings can also be obtained.

EXAMPLE 2

In this example, a stainless steel strip is coated with press lubricant by using the apparatus shown in FIG. 4(b). A stainless steel strip of 1.0 mm in thickness and 1000 mm in width is coated with DET (Pentaerythritol) lubricant (viscosity: 5000 cp at 25° C.). The lubricant is supplied onto the roll, which has recesses or grooves under a pressure of 0.3 kg/cm$^2$ by means of a pump. The recesses or grooves 300 on the roll 303 are square recesses or grooves of $140\mu \times 140\mu$ and $30\mu$ in depth, and there are 128 of such recesses or grooves arranged per 1 inch of the circumferential length of the roll. The excessive lubricant on the roll surface, other than that in the recesses or grooves, is removed by the doctor knife 302, and the lubricant in the recesses or grooves is transferred via the transfer roll 304 and the coating roll 306 onto the stainless steel strip. The thickness of the lubricant coating on the stainless steel strip ranges from 3 to $5\mu$ in a uniform and smooth film, and does not exceed the above range even when the coating speed varies in a range from 50 to 200 m/min.

EXAMPLE 3

A steel strip of 0.3 mm in thickness and 500 mm in width is coated with a ultraviolet ray hardening acrylic resin paint (viscosity: 400 cp at 25° C.) using the apparatus shown in FIG. 4(a). The roll dimensions and materials in this apparatus are the same as in Example 1. The paint is supplied under a pressure of 0.2 kg/cm$^2$ provided by a non-pulsive pump onto the roll 303 having recesses or grooves 300 through the supplying device 301. The paint transferred onto the roll 303 is spread smoothly by at least one smoothing roll 306 and applied onto the steel strip. Even when the running speed of the steel strip varies in a range from 50 to 200 m/min. the thickness of resultant paint coatings remains uniform within a range from 6 to $8\mu$.

What is claimed is:

1. A process of coating a metal strip with a high-viscosity coating material, which comprises:
    forcedly applying the coating material, having a viscosity of at least 500 cp, and being under a pressure of at least 0.2 kg/cm$^2$, to the surface of a gravure roll rotating at a circumferential speed of at least 50 m/min;
    removing any excess of said coating material from said surface of said gravure roll;
    transferring said coating material remaining on said surface of said gravure roll to a coating roll through a transfer roll; and
    coating said metal strip, running at a speed of at least 50 m/min, with said coating material from said coating roll.

2. A process according to claim 1, in which said coating material is pumped to and pressure fed onto said surface of said gravure roll through a slit nozzle.

3. A process according to claim 1, in which said pressure of said coating material is 1–2 kg/cm$^2$.

4. A process according to claim 1, in which at least one smoothing roll is provided at the surface of said coating roll and is rotated at a circumferential speed deviating no more than ±50% of that of said coating roll.

5. A process according to claim 1, in which the viscosity of said coating material is 1000 to 80,000 cp.

* * * * *